United States Patent [19]
Joiner et al.

[11] Patent Number: 5,683,944
[45] Date of Patent: Nov. 4, 1997

[54] METHOD OF FABRICATING A THERMALLY ENHANCED LEAD FRAME

[75] Inventors: Bennett A. Joiner; Greg L. Ridsdale, both of Austin, Tex.

[73] Assignee: Motorola, Inc., Schaumburg, Ill.

[21] Appl. No.: 522,889

[22] Filed: Sep. 1, 1995

[51] Int. Cl.⁶ .................... H01L 21/58; H01L 21/60
[52] U.S. Cl. .................. 437/220; 437/217; 437/209; 257/676
[58] Field of Search ............... 437/220, 217, 437/209, 206; 257/676

[56] References Cited

U.S. PATENT DOCUMENTS

| | | | |
|---|---|---|---|
| 4,298,883 | 11/1981 | Komatsu et al. | 437/220 |
| 4,445,271 | 5/1984 | Grabbe . | |
| 4,868,635 | 9/1989 | Frechette et al. | 357/70 |
| 4,918,511 | 4/1990 | Brown . | |
| 4,924,291 | 5/1990 | Lesk et al. | 357/70 |
| 4,977,474 | 12/1990 | Yasuhara et al. | 357/70 |
| 4,994,895 | 2/1991 | Matsuzaki et al. | 357/72 |
| 5,021,864 | 6/1991 | Kelly et al. | 437/220 |
| 5,021,865 | 6/1991 | Takahashi et al. | 357/70 |
| 5,202,288 | 4/1993 | Doering et al. | 427/209 |
| 5,225,710 | 7/1993 | Westerkamp | 257/713 |
| 5,227,662 | 7/1993 | Ohno et al. | 257/676 |
| 5,327,008 | 7/1994 | Djennas et al. | 257/666 |
| 5,429,992 | 7/1995 | Abbott et al. | 437/220 |
| 5,444,602 | 8/1995 | Banerjee et al. . | |

FOREIGN PATENT DOCUMENTS

| | | | |
|---|---|---|---|
| 60-072236 | 4/1985 | Japan . | |
| 62-79637 | 4/1987 | Japan | 437/220 |
| 63-44750 | 2/1988 | Japan | 437/220 |
| 63-204753 | 8/1988 | Japan . | |
| 63-239967 | 10/1988 | Japan . | |
| 2-94552 | 4/1990 | Japan | 437/220 |
| 2-114553 | 4/1990 | Japan | 437/220 |
| 3-296253 | 12/1991 | Japan . | |

*Primary Examiner*—John Niebling
*Assistant Examiner*—Kevin F. Turner

[57] ABSTRACT

The device has a semiconductor die (18) mounted upon a downset X-shape die support (12) of a lead frame (10, 40). The lead frame also has tie bars (16) which are connected to the X-shape die support. Attached to the tie bars are thermal bars (14, 14') which are located between the semiconductor die and inner portion of the leads (20). The inner portion of the leads, the tie bars, and the thermal bars are offset from the plane occupied by the X-shape die support. The thermal bars aid in dissipating the heat from the die into the nearby lead tips so that the heat can be conducted out of the package body (30) through the thermally conductive lead frame. The semiconductor die is wire bonded to the inner portion of the leads. A package body (30) protects the die, the wire bonds (26), the thermal bars, and the inner portion of the leads.

11 Claims, 2 Drawing Sheets

METHOD OF FABRICATING A THERMALLY ENHANCED LEAD FRAME

FIELD OF THE INVENTION

The present invention relates generally to a semiconductor device, and more specifically to a semiconductor device having a thermally enhanced lead frame and a method for its fabrication.

BACKGROUND OF THE INVENTION

With the increase in clock speeds and incorporation of more functions on integrated circuits (ICs), the power dissipation in the devices is increasing. This increase is occurring even with the use of lower voltages for the devices. At the same time, high cost IC packages are not an acceptable option to solve the power dissipation needs of the devices. However, the known methods of solving the thermal dissipation needs of the devices in the plastic encapsulated packages are contraindicated as a result of the need to improve the performance of the IC package when exposed to moisture and then subjected to a soldering or board mounting operation. The typical method to improve the thermal performance of the package is the use of a large flag to act as a heat spreader. Such a technique causes more package cracking and delamination of the material interfaces within the package when subjected to the moisture performance testing or a board mounting process.

Typical methods for improving moisture performance minimize the size of the flag. Previous designs to minimize the flag have used various openings in the flag under the die. This modification causes only minor changes in thermal performance. A die support structure similar to the ones taught in U.S. Pat. No. 5,327,008 provides much improved moisture performance. One assumes that die support structures such as the ones taught by U.S. Pat. No. 5,021,865, U.S. Pat. No. 4,994,895, Japanese abstract JP60072236, and Japanese abstract JP63204753, will have similar benefits. These structures have significantly lower thermal performance than the earlier designs with openings in the flag under the die. A thermal simulation of the junction to ambient thermal resistance, $\theta_{JA}$, demonstrates an increase in $\theta_{JA}$ of some 5 to 15% compared to a standard flag design or a flag design with openings under the die. The range in thermal performance differences is a function of die size and die size to inner lead distance.

Other attempts to improve the thermal performance of plastic encapsulated packages have primarily included the use of heat spreaders. These spreaders have included various designs in which the spreaders are either placed in the mold tool and encapsulated or are adhesively attached to the die or lead frame prior to the encapsulation process. The following patents are considered to be typical of these efforts to achieve good thermal performance:

U.S. Pat. No. 5,227,662 which teaches heat spreaders adhesively attached to the lead frame.

U.S. Pat. No. 5,225,710 which teaches a heat spreader which is in proximity to the flag and spreads the heat inside the molded body.

U.S. Pat. No. 5,202,228 which teaches a heat spreader which is used for the flag. The spreader is attached to a frame supported by tie bars.

However, these designs require additional process steps and piece parts which add significantly to the cost of the device. Moreover, they do nothing for the package cracking or delamination performance of the devices when they are subjected to moisture testing or board mounting.

A patent which typifies previous efforts toward a low cost package with good moisture performance without compromising thermal performance is U.S. Pat. No. 4,924,291. FIGS. 5 through 8 show a guard ring around the die. Nevertheless, this configuration fails to meet the desired goals for the following reasons. The adhesive die attachment will lead to high stress concentrations, especially at the corners and edge of the die if the lead frame is made from an alloy with sufficient thermal conductivity to improve the thermal performance of the package. Using copper lead frames would not be feasible with this design because of the large thermal expansion mismatch of the materials. There is not a low thermal conductivity path between the die and the guard ring because of the limited area available for the adhesive connection at the edge of the die. This lead frame also requires a lead frame design for each die size to be packaged. This is a significant cost adder due to the cost of stamping tools, or alternatively the cost of etched lead frames which is a more expensive process than stamping.

Clearly, an improved design for thermal performance is needed to eliminate this decrease in thermal performance while retaining the improvements in package cracking and delamination performance of the device.

DETAILED DESCRIPTION OF A PREFERRED EMBODIMENT

Generally, the invention provides a semiconductor device having an optimized flag design while concurrently having enhanced thermal dissipation as required by newer more powerful devices that also tend to be large in size. The device has a semiconductor die mounted upon an X-shape die support of a lead frame. The lead frame has leads that are located on a first plane. The X-shape die support is downset such that it is located on a second plane. The lead frame also has tie bars which are connected to the X-shape die support. The tie bars are located on the same first plane as the leads. Attached to the tie bars are thermal bars which are located between the semiconductor die and inner portion of the leads. The thermal bars help to dissipate the heat from the die itself into the nearby lead tips so that the heat can be conducted out of the package body through the thermally conductive lead frame. The semiconductor die is wire bonded to the inner portion of the leads. A package body protects the die, the wire bonds, the thermal bars, and the inner portion of the leads.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
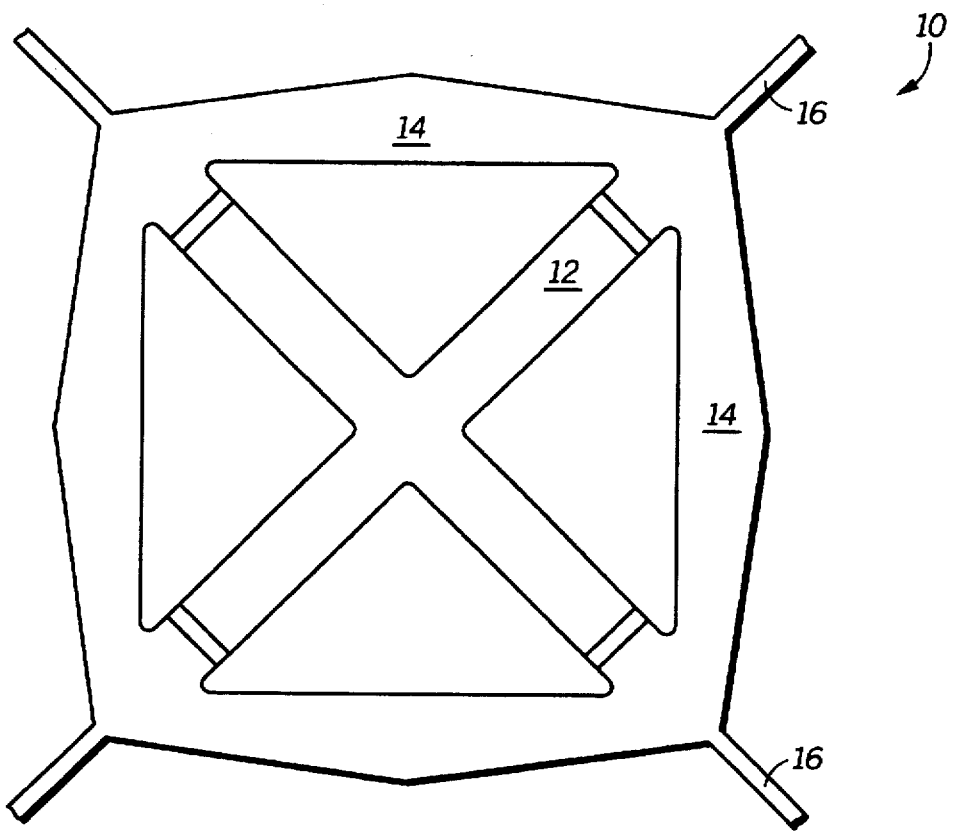
FIG. 1 illustrates, in an enlarged top view, a portion of a lead frame having an X-shape die support and thermal bars in a first embodiment of the invention.

FIG. 1 illustrates, in an enlarged top view, a portion of a lead frame 10 having an X-shape die support 12 and thermal bars 14 in a first embodiment of the invention. As depicted, the thermal bars 14 are attached to the tie bars 16 which extend diagonally inward. The X-shape die support 12 is also connected to the tie bars 16, but is downset from the tie bars 16 such that the X-shape die support 12 and the tie bars 16 are located on different planes. The downset would typically range from 0.10 mm (4 mils) to 0.3 mm (12 mils). The thermal bars 14 are located on the same plane as the tie bars 16. Copper alloys, such as CDA 19400, are the preferred materials for the lead frame because of their good thermal conductivity. However, alloy 42 and other lead frame materials may also be used.

Figure 2:
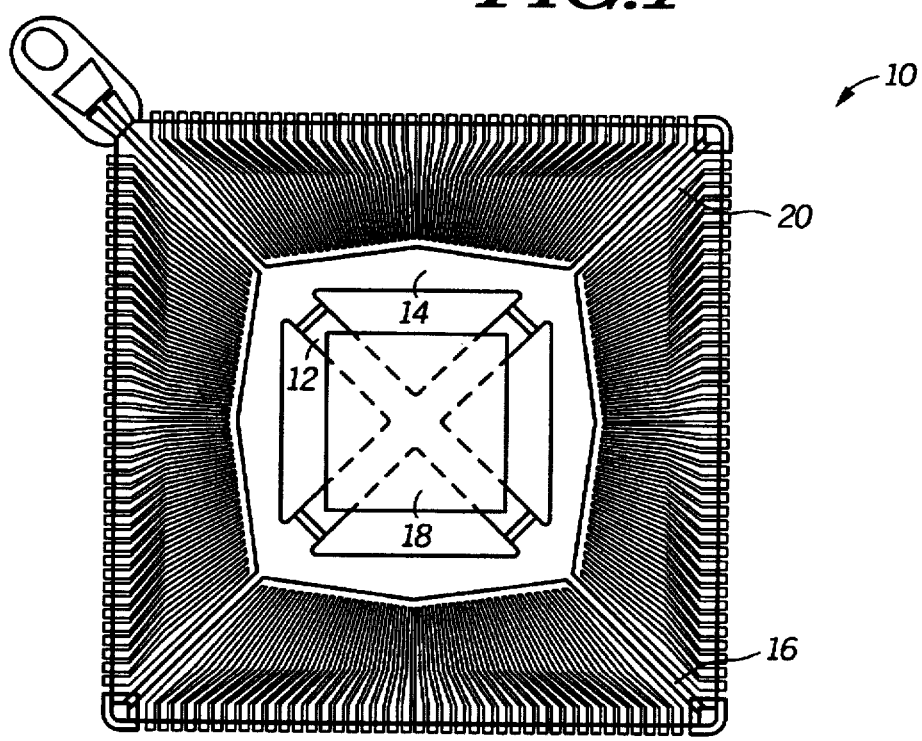
FIG. 2 illustrates, in a top view, a lead frame of FIG. 1 having a semiconductor die mounted on the X-shape die support.

FIG. 2 illustrates, in a top view, the lead frame 10 of FIG. 1 having a semiconductor die 18 mounted on the X-shape die support 12. Additionally illustrated in this figure are leads 20 which extend inward toward the semiconductor die 18. The inner portion of the leads, i.e. the lead tips, define a cavity within which the semiconductor die is located. As shown, the semiconductor die 18 is solely supported by the X-shape die support 12. The die does not come into contact with the thermal bars 14. However, the thermal bars 14 are situated between the semiconductor die 18 and the inner portion of the leads 20. There is a separation of approximately 0.35 mm between the edge of the thermal bars 14 and the inner lead tips. This particular placement is important because the thermal bars 14 aid in the conduction of heat away from the semiconductor die into the leads to be dispersed to the ambient over the larger surface area of the entire lead frame 10. The thermal bars 14 essentially bridge a gap between the edge of the semiconductor die and the lead tips of the lead frame. This feature is an improvement over the prior art because it allows both a reduced die support area for better package cracking and delamination performance yet at the same offering enhanced thermal dissipation as required by the newer more powerful devices, such as high input/output (I/O) count microprocessors and application specific integrated circuits (ASICs).

Figure 3:
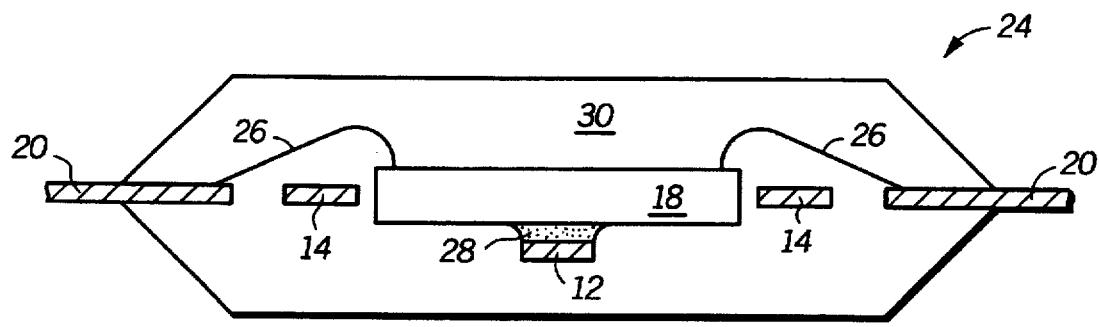
FIG. 3 illustrates, in cross-section, a packaged semiconductor device of FIG. 2.

FIG. 3 illustrates, in cross-section, a packaged semiconductor device 24 of FIG. 2. This figure shows that the semiconductor die 18 is wire bonded to the lead tips of the leads 20 with a plurality of wire bonds 26. Methods of wire bonding are well known in the art. Additionally shown is the mounting of the semiconductor die upon the die support with a suitable die attach adhesive 28. Die attach adhesive 28 can be any of a number of commercially available thermoset or thermoplastic adhesives. It may be dispensed in paste form, or it may be applied in B-stage form. A package body 30 encapsulates the semiconductor die, the wire bonds, the thermal tab, and the inner portion of the leads. Package body 30 is composed of a polymeric molding compound, such as an epoxy resin-based molding compound. Methods of molding such a material are well known in the art.

This cross-sectional view of FIG. 3 more clearly illustrates the relationship between the die support 12, the semiconductor die 18, and the thermal bars 14. The die support is downset below the level of the tie bars, the leads and the thermal bars, all of the latter being on the same plane. The downsetting of the die support is done to balance the amount of plastic above and below the semiconductor die to minimize stresses on the die surface. However, by having the thermal bars on the same plane as the leads, heat can be more efficiently conducted away from the die into the leads than if the thermal bars were on a plane different from the leads.

Figure 4:
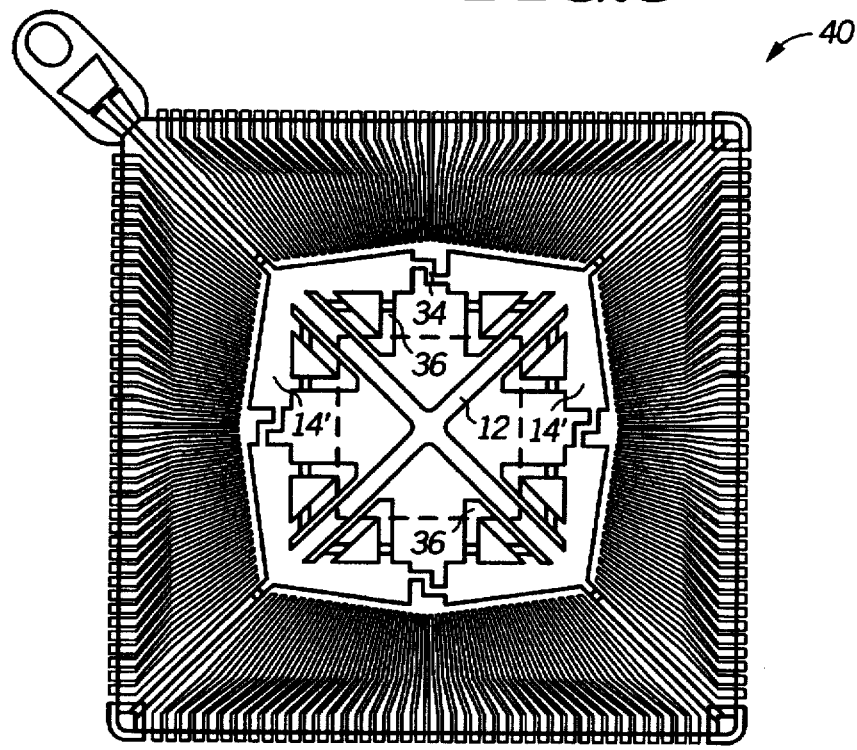
FIG. 4 illustrates, a top view, a lead frame having an X-shape die support, thermal tabs, and die undertabs in another embodiment of the invention.
Figure 5:
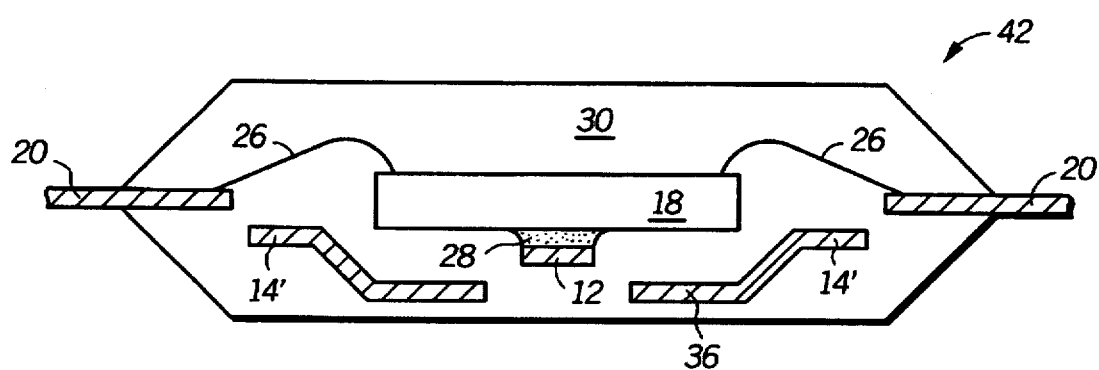
FIG. 5 illustrates, in cross-section, a packaged semiconductor device of FIG. 4.

FIG. 4 illustrates, a top view, a lead frame 40 having an X-shape die support 12, thermal bars 14', and die undertabs 36 in another embodiment of the invention. In this embodiment additional tabs are attached to the thermal bars 14'. These tabs are herein referred to as die undertabs 36 because they extend below the semiconductor die. The dashed square in the center of the figure denotes where the semiconductor die would be located once mounted on the lead frame. The die undertabs 36 extending below the semiconductor die is more clearly shown in FIG. 5 which is a cross-sectional view of a packaged semiconductor device 42. The die undertabs 36 are separate from the X-shape die support 12 and are located on a different plane than the die support. The intent is to create another path for the heat from the semiconductor die 18 to be conducted away from the die. As shown in FIG. 5, the die undertabs 36 are coupled to the semiconductor die backside by the package body 30, which is typically a molded encapsulant. In this illustration, the thermal bars 14' are not on the same plane as the leads 20. Nevertheless, by using a different downset operation, it is possible to locate the thermal bars on the same plane as the leads. However, such a downset operation is more difficult to perform than a standard downset operation.

Referring to FIG. 4, the thermal bars 14' are not solid members extending between two tie bars. Instead, the thermal bars are separate members, but are connected to each other by a stress relief connecting member 34 to prevent dislocation or flexing of the thermal bars prior to molding. Placing the small stress relief connecting members 34 on the center line of the device does not affect the thermal performance of the package. At the same time, they serve to reduce stress caused by the different coefficient of thermal expansion of the encapsulation material and the lead frame by flexing since they are designed in a compliant configuration as opposed to being simple beams.

While both embodiments allow a range of die sizes to be built on the same lead frame, the die undertabs are especially effective in minimizing the thermal performance impact caused by decrease in die size. Because this lead frame design permits a range of die sizes, it has an inherent cost advantage compared to the window flag lead frame.

The foregoing description and illustrations contained herein demonstrate many of the advantages associated with the present invention. In particular, it has been revealed that a semiconductor device having a thermally enhanced lead frame is made possible by adding thermal bars to the lead frame. The thermal bars increase the rate and amount of heat conduction away from the semiconductor die by dissipating the heat into the leads of the lead frame which then exit the package body. The addition of the thermal bars do not sacrifice the package cracking and delamination performance of the packaged semiconductor device because the optimal die support shape is retained. Yet practicing the invention allows enhanced thermal dissipation that was not possible with the prior art devices.

Thus it is apparent that there has been provided, in accordance with the invention, a semiconductor device having a thermally enhanced lead frame and a method for its fabrication that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the lead frame need not have symmetrical thermal bars in all quadrants of the lead frame. Instead, the lead frame may have only one or two thermal bars depending on the heat dissipation requirements of the semiconductor die. In addition, the invention is not limited to any particular type of semiconductor die although a die of at least 300 mils (7.6 mm) per side would be the typical situation. Furthermore, connections between the thermal bar and certain leads to enhance thermal performance may be possible. Such a structure can also be used as an electrical bus to minimize inductance by electrically connecting leads in parallel. The thermal bar also provides an excellent place for multiple ground bonds, for example. In some cases the width of the thermal bar may exceed acceptable design rules for package cracking and delamination performance; thus, holes or slots may be incorporated into the thermal bars to minimize such risks. Yet another variation would be to employ narrow support rails and pads on the X shaped die support for die attachment. Therefore, it is intended that this invention encompasses all such variations and modifications falling within the scope of the appended claims.

We claim:

1. A method for making a semiconductor device, comprising the steps of:

providing a lead frame having:
a plurality of leads arranged around a centrally located cavity, the plurality of leads having an inner portion and an outer portion, and wherein the inner portion of the plurality of leads is disposed on a first plane;
a plurality of tie bars;
an X-shape die support which is attached to the plurality of tie bars, wherein the X-shape die support is disposed in the centrally located cavity on a second plane; and
a thermal tab attached to one of the plurality of tie bars, wherein the thermal tab is substantially coplanar with the plurality of leads;

mounting a semiconductor die onto the X-shape die support of the lead frame, wherein the semiconductor die is disposed in the centrally located cavity such that the thermal tab lies between an edge of the semiconductor die and the inner portion of the plurality of leads, and wherein the semiconductor die is mounted onto the X-shape die support such that the semiconductor die does not overlie the thermal tab and the semiconductor die does not contact the thermal tab;

wire bonding the semiconductor die to the inner portion of the plurality of leads to form a plurality of wire bonds; and forming a package body around the semiconductor die, the plurality of wire bonds, the inner portion of the plurality of leads, and the thermal tab.

2. The method of claim 1, wherein the step of providing the lead frame provides a copper lead frame.

3. The method of claim 1, wherein the step of mounting the semiconductor die mounts a die selected from a group consisting of a microprocessor and an application specific integrated circuit (ASIC).

4. The method of claim 1, wherein the step of wire bonding uses low loop wire bonding.

5. The method of claim 1, wherein the step of forming the package body comprises molding.

6. A method for making a semiconductor device, comprising the steps of:

providing a lead frame having:
a plurality of leads arranged around a centrally located cavity, the plurality of leads having an inner portion and an outer portion, and wherein the inner portion of the plurality of leads is disposed on a first plane;
a plurality of tie bars;
an X-shape die support which is attached to the plurality of tie bars, wherein the X-shape die support is disposed in the centrally located cavity on a second plane;
a thermal tab attached to one of the plurality of tie bars; and
a die undertab extending from the thermal tab, such that the die undertab is disposed on a third plane mounting a semiconductor die onto the X-shape die support of the lead frame, wherein the semiconductor die is disposed in the centrally located cavity such that the thermal tab lies between an edge of the semiconductor die and the inner portion of the plurality of leads and the semiconductor die does not overlie the thermal tab and the semiconductor die does not contact the thermal tab, and wherein the semiconductor die is mounted onto the X-shape die support such that it overlies the die undertab:

wire bonding the semiconductor die to the inner portion of the plurality of leads to form a plurality of wire bonds; and forming a package body around the semiconductor die, the plurality of wire bonds, the inner portion of the plurality of leads, the thermal tab, and the die undertab, wherein the package body is composed of a polymeric encapsulant such that a portion of the polymeric encapsulant lies between the die undertab and a backside of the semiconductor die.

7. The method of claim 6, wherein the step of providing the lead frame provides a copper lead frame.

8. The method of claim 6, wherein the step of mounting the semiconductor die mounts a die selected from a group consisting of a microprocessor and an application specific integrated circuit (ASIC).

9. The method of claim 6, wherein the step of wire bonding uses low loop wire bonding.

10. The method of claim 6, wherein the step of forming the package body comprises molding.

11. A method for making a semiconductor device, comprising the steps of:

providing a lead frame having:
a plurality of leads arranged around a centrally located cavity, the plurality of leads having an inner portion and an outer portion, and wherein the inner portion of the plurality of leads is disposed on a first plane;
a plurality of tie bars;
an X-shape die support which is attached to the plurality of tie bars, wherein the X-shape die support is disposed in the centrally located cavity on a second plane, wherein the plurality of tie bars is disposed on the first plane;
a thermal tab attached to one of the plurality of tie bars, wherein the thermal tab is substantially coplanar with the plurality of tie bars; and
a die undertab extending from the thermal tab located on the first plane such that the die undertab is disposed on a third plane;

mounting a semiconductor die onto the X-shape die support of the lead frame, wherein the semiconductor die is disposed in the centrally located cavity such that the thermal tab lies between an edge of the semiconductor die and the inner portion of the plurality of leads and such that the thermal tab does not contact the semiconductor die but is positioned to conduct heat away from the semiconductor die into the plurality of leads through the inner portion of the plurality of leads, and wherein the semiconductor die is mounted onto the X-shape die support such that the semiconductor die does not overlie the thermal tab;

wire bonding the semiconductor die to the inner portion of the plurality of leads to form a plurality of wire bonds; and forming a package body around the semiconductor die, the plurality of wire bonds, the inner portion of the plurality of leads, and the thermal tab, wherein the package body is composed of a polymeric encapsulant such that a portion of the polymeric encapsulant couples the die undertab to a backside of the semiconductor die.

* * * * *